United States Patent
Chiou et al.

(10) Patent No.: US 11,638,978 B2
(45) Date of Patent: *May 2, 2023

(54) LOW-DEBRIS FLUOPOLYMER COMPOSITE CMP POLISHING PAD

(71) Applicant: Rohm and Haas Electronic Materials CMP Holdings, Inc., Newark, DE (US)

(72) Inventors: Nan-Rong Chiou, Wilmington, DE (US); Joseph So, Wilmington, DE (US); Mohammad T. Islam, New Catle, DE (US); Matthew R. Gadinski, Newark, DE (US); Youngrae Park, Wilmington, DE (US); George C. Jacob, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 938 days.

This patent is subject to a terminal disclaimer.

(21) Appl. No.: 16/435,990

(22) Filed: Jun. 10, 2019

(65) Prior Publication Data

US 2020/0384603 A1 Dec. 10, 2020

(51) Int. Cl.
*B24B 37/24* (2012.01)
*B24B 37/22* (2012.01)
(Continued)

(52) U.S. Cl.
CPC .......... *B24B 37/24* (2013.01); *B24B 37/0056* (2013.01); *B24B 37/22* (2013.01);
(Continued)

(58) Field of Classification Search
None
See application file for complete search history.

(56) References Cited

U.S. PATENT DOCUMENTS

| 6,390,890 B1 | 5/2002 | Molnar |
| 6,638,143 B2 | 10/2003 | Wang et al. |

(Continued)

FOREIGN PATENT DOCUMENTS

WO 2006089293 8/2006

OTHER PUBLICATIONS

Armin, et al., Nanoscale Indentation of Polymer and Composite Polymer-Silica Core-Shell Submicrometer Particles by Atomic Force Microscopy, Langmuir, (2007).

(Continued)

*Primary Examiner* — Sylvia MacArthur
(74) *Attorney, Agent, or Firm* — John J. Piskorski; Blake T. Biederman

(57) ABSTRACT

The invention provides a polymer-polymer composite polishing pad useful for polishing or planarizing a substrate of at least one of semiconductor, optical and magnetic substrates. The polymer-polymer composite polishing pad includes a polishing layer having a polishing surface for polishing or planarizing the substrate; a polymeric matrix forming the polishing layer and including gas-filled or liquid-filled polymeric microelements; and fluoropolymer particles embedded in the polymeric matrix. The fluoropolymer particles have a tensile strength lower than the tensile strength of the polymeric matrix wherein diamond abrasive materials cut the fluoropolymer to form a reduced number of pad debris particles in the 1 μm to 10 μm size range.

10 Claims, 6 Drawing Sheets

(51) Int. Cl.
*C09G 1/02* (2006.01)
*C08F 214/26* (2006.01)
*B24B 37/005* (2012.01)
*C08L 27/18* (2006.01)
*H01L 21/321* (2006.01)

(52) U.S. Cl.
CPC .......... *C08F 214/262* (2013.01); *C08L 27/18* (2013.01); *C09G 1/02* (2013.01); *H01L 21/3212* (2013.01)

(56) References Cited

U.S. PATENT DOCUMENTS

| | | | |
|---|---|---|---|
| 6,641,632 | B1 | 11/2003 | Ronay |
| 7,169,030 | B1* | 1/2007 | Kulp ................. B24D 3/32 |
| | | | 451/526 |
| 7,273,407 | B2* | 9/2007 | Saikin ............. B24B 37/205 |
| | | | 451/6 |
| 9,056,382 | B2 | 6/2015 | Litke et al. |
| 11,285,577 | B2* | 3/2022 | Islam ................. C09D 175/08 |
| 2002/0086615 | A1* | 7/2002 | Moon ................. B24B 37/26 |
| | | | 451/25 |
| 2005/0042976 | A1 | 2/2005 | Ronay |
| 2005/0176251 | A1 | 8/2005 | Duong |
| 2008/0182492 | A1* | 7/2008 | Crkvenac ............ B24D 11/04 |
| | | | 451/527 |
| 2013/0303061 | A1* | 11/2013 | James ................ B24B 37/24 |
| | | | 451/526 |
| 2020/0384603 | A1* | 12/2020 | Chiou ............... B24B 37/0056 |

OTHER PUBLICATIONS

Armini, et al., Composite Polymer-Core Silica-Shell Abrasive Particles During Oxide CMP A Detectivity Study, Journal of The Electrochemical Society, vol. 154, issue 8, (2007).
Armini, et al., Composite Polymer Core-Ceria Shell Abrasive Particles During Oxide CMP: A Detectivity Study, Journal of The Electrochemical Society, vol. 155, issue 9, (2008).
Hattori, et al., Surface Charge and Properties of Rare Earth Metal Oxide In Particles In Water, Proceedings of International Symposium on Eco Topia Science (2007).
Li et al., CMP Solutions for 3D-NAND Staircase CMP, Proceedings of 2015 International Conference on Planarization, Chandler, AZ (2015).
Copending U.S. Appl. No. 16/435,963.
Copending U.S. Appl. No. 16/436,019.
Copending U.S. Appl. No. 16/436,041.
Copending U.S. Appl. No. 16/435,931.
Copending U.S. Appl. No. 16/435,913.

* cited by examiner

LOW-DEBRIS FLUOPOLYMER COMPOSITE CMP POLISHING PAD

BACKGROUND OF THE INVENTION

Chemical Mechanical Planarization (CMP) is a variation of a polishing process that is widely used to flatten, or planarize, the layers of construction of an integrated circuit in order to precisely build multilayer three dimensional circuitry. The layer to be polished is typically a thin film (less than 10,000 Angstroms) that has been deposited on an underlying substrate. The objectives of CMP are to remove excess material on the wafer surface to produce an extremely flat layer of a uniform thickness, the uniformity extending across the entire wafer. Control of removal rate and the uniformity of removal are of paramount importance.

CMP utilizes a liquid, often called slurry, which contains nano-sized particles. This is fed onto the surface of a rotating multilayer polymer sheet, or pad, which is mounted on a rotating platen. Wafers are mounted into a separate fixture, or carrier, which has a separate means of rotation, and pressed against the surface of the pad under a controlled load. This leads to a high rate of relative motion between the wafer and the polishing pad (i.e., there is a high rate of shear at both the substrate and the pad surface. Slurry particles trapped at the pad/wafer junction abrade the wafer surface, leading to removal. In order to control rate, prevent hydroplaning, and to efficiently convey slurry under the wafer, various types of texture are incorporated into the upper surface of the polishing pad. Fine-scale texture is produced by abrading the pad with an array of fine diamonds. This is done to control and increase removal rate, and is commonly referred to as conditioning. Larger scale grooves of various patterns and dimensions (e.g., XY, circular, radial) are also incorporated for slurry transport regulation.

Removal rate during CMP is widely observed to follow the Preston Equation, Rate=$K_p$*P*V, where P is pressure, V is velocity, and $K_p$ is the so-called Preston Coefficient. The Preston Coefficient is a lumped sum constant that is characteristic of the consumable set being used. Several of the most important effects contributing to $K_p$ are provided as follows:
  (a) pad contact area (largely derived from pad texture and surface mechanical properties);
  (b) the concentration of slurry particles on the contact area surface available to do work; and
  (c) the reaction rate between the surface particles and the surface of the layer to be polished.

Effect (a) is largely determined by pad properties and the conditioning process. Effect (b) is determined by both pad and slurry, while effect (c) is largely determined by slurry properties.

The advent of high capacity multiple layer memory devices (e.g., 3D NAND flash memory) has led to a need for further increases in removal rate. The critical part of the 3D NAND manufacturing process consists of building up multilayer stacks of $SiO_2$ and $Si_3N_4$ films in an alternating fashion in a pyramidal staircase fashion. Once completed, the stack is capped with a thick $SiO_2$ overlayer, which must be planarized prior to completion of the device structure. This thick film is commonly referred to as the pre-metal dielectric (PMD). The device capacity is proportional to the number of layers in the layered stack. Current commercial devices use 32 and 64 layers, and the industry is rapidly moving to 128 layers. The thickness of each oxide/nitride pair in the stack is ~125 nm. Thus the thickness of the stack increases directly with the number of layers (32=4,000 nm, 64=8,000 nm, 128=16,000 nm). For the PMD step, the total amount of capping dielectric to be removed is approximately equal to ~1.5 times the stack thickness, assuming a conformal deposition of the PMD.

Conventional dielectric CMP slurries have removal rates of ~250 nm/min. This yields undesirably lengthy CMP process times for the PMD step, which now is the primary bottleneck in the 3D NAND manufacturing process. Consequently, there has been much work on developing faster CMP processes. Most improvements have focused on process conditions (higher P and V), changing the pad conditioning process, and improvements in slurry design, particularly in ceria-based slurries. If an improved pad could be developed that can be paired with the existing processes and ceria slurries to achieve higher removal rate without introducing any negative effects, it would constitute a significant improvement in CMP technology.

Hattori et al (Proc. ISET07, p. 953-4 (2007)) discloses comparative zeta potential vs. pH plots for various lanthanide particle dispersions, including ceria. The pH of zero charge (often termed the isoelectric pH) was measured as ~6.6. Below this pH, the particle has a positive potential; above this pH the particle has a negative potential. For inorganic particles, such as silica and ceria, the isoelectric pH and the surface charge at pH above and below the isoelectric pH are determined by the acid/base equilibrium of the surface hydroxyl groups.

For the case of polishing dielectrics with commercial ceria slurries and conventional pads, the electrostatic attraction between the particle and pad gives rise to a characteristic rate dependence on particle concentration in the slurry. As discussed by Li et al (Proceedings of 2015 Intl. Conf. on Planarization, Chandler, Ariz., p. 273-27 (2015)) the concentration dependence of colloidal ceria particle on dielectric polishing rates at pH below the isoelectric pH of the slurry shows saturation behavior at very low particle concentration (~1%). Above this concentration, addition of more particles has no effect on polishing rate. For systems where the particle/pad interactions are repulsive, no such saturation behavior is seen. The economic benefits of low particle concentration ceria slurries for dielectric polishing have been a major driving force for its commercial use, despite its relatively higher price.

For dielectric CMP using silica-based slurries, the majority of the slurries used are alkaline, typically at pH 10 or higher. Since the silica particles have an isoelectric pH of −2.2; the consequence is that they have a high negative charge at the slurry pH.

Prior art pad design has largely neglected pad polymer modification as a means to achieving increased rates. The primary methods used to achieve increased rate in CMP pads are as follows:
  a) optimization of groove design without changing the composition of the top pad layer;
  b) alter the conditioning process without changing the composition of the top pad layer;
  c) provide pads with more desirable conditioning response by changing the conditioning response of the top pad layer; and
  d) provide pads with top pad layers having higher hardness or modified elastic properties.

Despite all these solutions, there remains a need to develop planarizing polishing pads that increase removal rate without a significant increase in polishing defects for polishing with both anionic and cationic particle slurries.

STATEMENT OF THE INVENTION

An aspect of the invention provides a polymer-polymer composite polishing pad useful for polishing or planarizing a substrate of at least one of semiconductor, optical and magnetic substrates, the polymer-polymer composite polishing pad comprising the following: a polishing layer having a polishing surface for polishing or planarizing the substrate; a polymeric matrix forming the polishing layer, the polymer matrix having a tensile strength, the polymer matrix including gas-filled or liquid-filled polymeric microelements; and fluoropolymer particles embedded in the polymeric matrix between the gas-filled or liquid-filled polymeric microelements, the fluoropolymer particles having a tensile strength lower than the tensile strength of the polymeric matrix wherein diamond abrasive materials cut the fluoropolymer to form a reduced number of pad debris particles in the 1 μm to 10 μm size range.

Another aspect of the invention provides a polymer-polymer composite polishing pad useful for polishing or planarizing a substrate of at least one of semiconductor, optical and magnetic substrates, the polymer-polymer composite polishing pad comprising the following: a polishing layer having a polishing surface for polishing or planarizing the substrate; a polymeric matrix forming the polishing layer, the polymer matrix having a tensile strength, the polymer matrix including gas-filled or liquid-filled polymeric microelements; and fluoropolymer particles embedded in the polymeric matrix between the gas-filled or liquid-filled polymeric microelements, the fluoropolymer particles having an average particle size less than the average spacing of the polymeric microelements, the fluoropolymer particles having a tensile strength lower than the tensile strength of the polymeric matrix wherein diamond abrasive materials cut the fluoropolymer to form a reduced number of pad debris particles in the 1 μm to 10 μm size range.

DETAILED DESCRIPTION OF THE INVENTION

Figure 1:
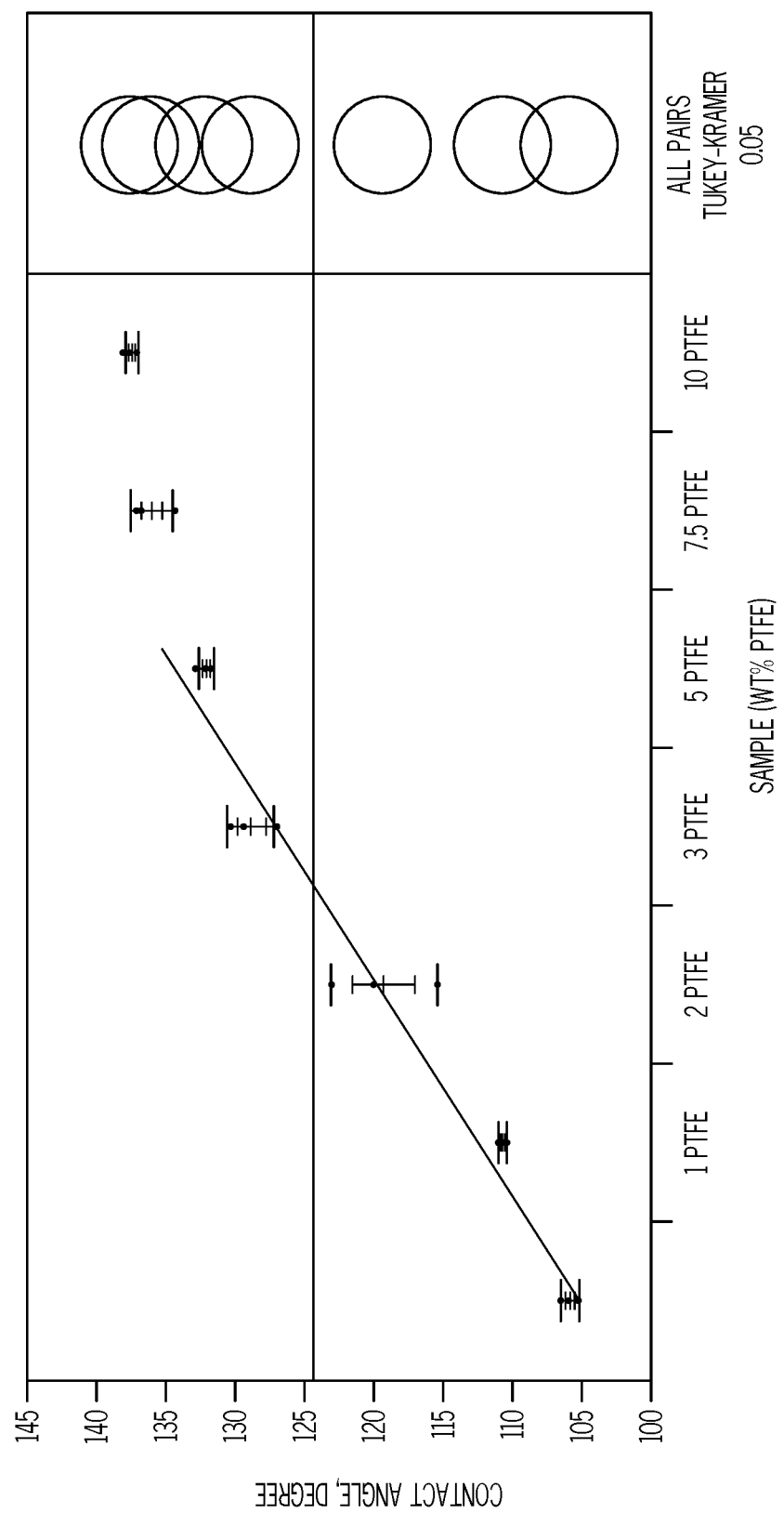
FIG. 1 is a plot of contact angle versus percent PTFE addition for a polyurethane polishing pad.

The invention provides a polymer-polymer composite polishing pad useful for polishing or planarizing a substrate of at least one of semiconductor, optical and magnetic substrates. The invention has particular value for planarizing patterned silicon wafers with slurries containing cationic abrasive particles. A key element of the present invention is the modification of the top pad surface properties to facilitate enhanced adsorption of slurry particles onto the upper surface through the incorporation of fluoropolymer particles into the polishing pad's matrix. An unexpected and novel effect in pads of the present invention, is that the addition of low tensile strength fluoropolymer particles in relatively low concentration of approximately 1 to 20 wt % of the total polymer concentration) yields improved removal rate and desirably highly negative or positive surface zeta potential. Unless specifically noted otherwise, this specification provides all concentrations in weight percent. Typically, the zeta potential of the fluoropolymer is more negative than the matrix as measured in distilled water at a pH of 7. This increase in negativity can facilitate preferential attraction of positively charged particles to polishing asperities located at the polishing surface of the polishing pad during polishing. For purposes of this specification, positively charged particles include cationic particles such as ceria, titania, nitrogen doped silica, aminosilane-coated silica and particles modified with cationic surfactants. In particular, the fluoropolymer-modified pads are quite effective for polishing with ceria-containing slurries. The polishing surface is hydrophilic as measured with distilled water at a pH of 7 at a surface roughness of 10 μm rms after soaking in distilled water for five minutes. For example, at a pH of 7, polyurethane will generally have a zeta potential in the range of −5 mV to −15 mV. The zeta potential of polyurethane is typically positive at low pH levels and becomes negative with increasing pH levels. Most fluoropolymer particles, however, are hydrophobic and have a zeta potential of −20 mV to −50 mV at pH 7. The zeta potential of the fluoropolymers tend to have less variation with change in pH level than polyurethane.

During polishing, conditioners, such as diamond conditioning disks cut the polishing pad to expose fresh fluoropolymer to the surface. A portion of this fluoropolymer extends upward to form raised surface areas on the polishing pad. Then the wafer rubs against the fluoropolymer to form a thin film on the polishing pad surface. This film tends to be rather thin, such as ten or less atom layers thick. These thin films are so thin that they are typically not visible with standard scanning electron microscopes. The fluorine concentration of this film, however, is visible by x-ray photoelectron spectroscopy instruments. This instrument can measure fluorine and carbon concentrations with a penetration depth of 1 to 10 nm. It is critical that this film only cover a portion of the polishing surface. If the fluoropolymer film covers the entire surface, then the polishing pad remains hydrophobic during polishing. Unfortunately, these hydrophobic pads tend to provide inefficient polishing removal rates. Furthermore it is critical that the polymer matrix maintains sufficient mechanical integrity in order that it can facilitate the smearing of the fluoropolymer onto the polymer matrix. For example and most advantageously, slicing the polishing pad below the polishing surface and parallel to the polishing layer leaves one end of the fluoropolymer particles anchored in the polymeric matrix while the other end can plastically deform at least 100% in elongation.

The polishing surface must include sufficient matrix polymer at the polishing surface to wet the pad during polishing. This hydrophilic interaction between the polishing pad and the slurry is important for maintaining efficient slurry distribution and polishing. For purposes of this specification, hydrophilic polishing surface refers to a polishing pad with a surface roughness of 10 μm rms after soaking in distilled water (pH 7) for five minutes. Diamond conditioning creates the surface texture. Under some circumstances, it is possible to simulate diamond conditioning with an abrasive cloth, such as sand paper. Typically, the fluoropolymer film covers 20 to 80 percent of the polishing pad surface. A comparison between fluorine concentration as measured with an X-ray photoelectron spectroscopy and deeper penetrating energy-dispersion X-ray spectroscopy at a penetration depth of 1 to 10 µm provides conclusive evidence of this film. The pads can generate a fluorine concentration at least ten atomic percent higher measured at a penetration depth of 1 to 10 nm than in the bulk of the matrix measured at a penetration depth of 1 to 10 µm. Preferably, the pads can generate a fluorine concentration at least twenty atomic percent higher measured at a penetration depth of 1 to 10 nm than in the bulk of the matrix measured at a penetration depth of 1 to 10 µm.

Moreover, another unanticipated effect of the addition of low tensile strength fluoropolymers in relatively low concentration of approximately 1 to 20 wt % of the total polymer concentration) is that it results in a significant reduction in the size of the pad conditioning debris. The fluoropolymer particles, however, can function effectively when they comprise 2 to 30 volume percent of the polymer-polymer composite pad. This is believed to be a factor in the reduction in defectivity observed. Yet another unexpected and novel effect in pads of the present invention is that the surface zeta potential of the pad may be modified by changing the particular fluoropolymer added to the parent polymer. This allows the pad to produce enhanced polishing rates for multiple types of slurries while maintaining the desirably low sizes of pad conditioning debris, thus improving defect levels, and maintaining the desirable properties of the parent pad with respect to planarization. In addition, the negative zeta potential can help stabilize the slurry to limit detrimental particle precipitation that can result in detrimental wafer scratching. Thus, this limiting of particle precipitation can often result in lower polishing defects.

The addition of fluoropolymer particles to a parent polymer, such as a polyurethane block copolymer forms a multipolymer composite. Preferably, the matrix is a polyurethane block copolymer containing hard and soft segments. Unlike many other materials, fluoropolymers do not form bonds or linkages to the polyurethane matrix, but exist as a separate polymer or phase. This matrix can be either porous or non-porous. It is preferred that the fluoropolymers are significantly softer and more malleable than the surrounding matrix. It has been discovered that this low tensile strength allows the fluoropolymer to smear and form a thin film covering the matrix. The low tensile strength in combination with the smearing is critical to achieving excellent polishing results. Furthermore, the fluoropolymer addition weakens the polishing pad, but decreases the amount of 1 to 10 µm debris particles formed during polishing. When added in small amounts (1-20% by weight) the resulting material still has mechanical properties suitable for use as a polishing pad. But the response to the pad conditioning process is quite different. In fact, the fluoropolymer is capable of 100% elongation when trapped at one end in the polishing matrix. These fluoropolymers tend to fill in gaps between surface asperities and reduce surface roughness.

Fluorinated polymer particles (PTFE, PFA) when used as powder in commercial pad formulations show improvement in defects and polishing removal rate when polishing semiconductor substrates with cationic abrasives. The chemical structures of acceptable fluorinated additives are below as follows:

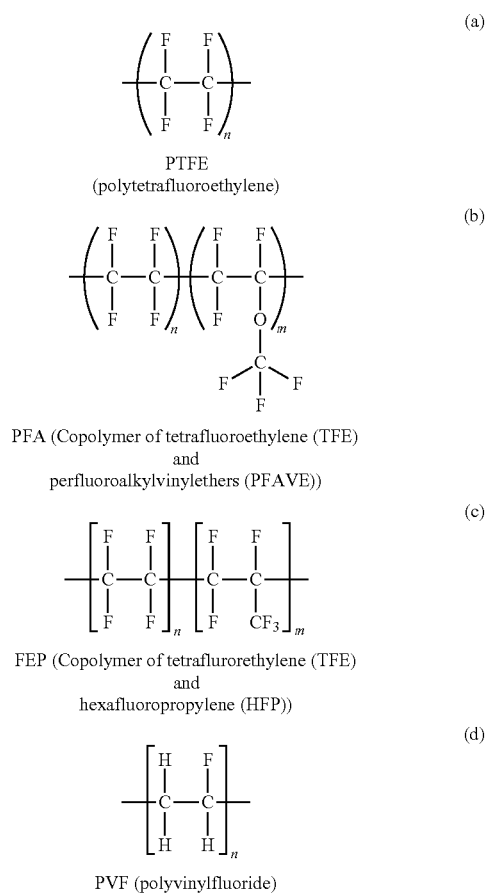

Additional acceptable examples of fluoropolymers are ETFE (ethylene tetrafluoroethylene), PVDF (polyvinylidene fluoride) and ECTFE (ethylene chlorotrifluoroethylene). Preferably, the fluoropolymer is selected from PTFE, PFA, FEP, PVF, ETFE, ECTFE and combinations thereof.

Many hydrophobic hydrocarbon polymers such as fluorine end-capped polytetrafluoroethylene (PTFE) have highly negative zeta potentials in water, typically less than −20 mV, and are quite hydrophobic, with static water contact angles of above 100 degrees. However, the contact angle hysteresis is extremely low. Typical advancing, static, and receding contact angles in water are 110°, 110°, and 95° respectively, i.e., the material surface remains highly hydrophobic. The explanation for the highly negative zeta potential of PTFE is simply that it is due to the high degree of orientation of the water dipole at the polymer surface together with the low surface polarity. Other hydrophobic fluoropolymers, such as polyvinylfluoride (PVF) have similar static water contact angles, but can have high positive zeta potentials in water, typically greater than +30 mV. PVF differs from PTFE in that it is much more polar. The positive zeta potential is due to the presence of nitrogen containing polymerization initiators that break apart and end cap the fluoropolymers. For example azo initiators can form cationic fluoropolymer particles for multiple fluoropolymers, including PTFE, PFA, FEP, PVF, ETFE, ECTFE and combinations thereof. Most preferably, the cationic fluoropolymer is PVF.

In the conditioning process, diamond crystals embedded in a metal or ceramic matrix act as cutting tools, cutting into the pad and removing material to form a resulting surface texture. There are two basic modes of diamond conditioning interaction, plastic deformation, and fracture. While the type, size, and number of diamond particles per unit area can have an effect, the polishing pad structure has a much bigger impact on the mode of material removal. At one extreme, a solid high toughness polymer is expected to result in a largely plastic mode of conditioning wear, producing furrows but not necessarily removing mass. At the other extreme, a brittle glassy polymer will favor pad removal via fracture, causing large chunks of the pad surface to be released into the slurry. For polymer composites or polymer foams, the volume fraction of the void or additive tends to shift the conditioning mode toward fracture, as fewer pad polymer bonds need to be broken to release a volume roughly equivalent to the interstitial space between said voids or second phase. For the closed cell polyurethane foams currently used in CMP pads, the sizes of these fracture fragments are quite large, typically tens of microns in size. Since these pads are relatively hard polymers, particles in this size range have been shown to cause scratching damage to the wafers being polished if they are trapped in the slurry film under pressure during CMP. For pads of the current invention, the addition of the fluoropolymer particles, especially for small diameters, markedly reduces the size of the conditioning debris, as they act to further weaken the tensile strength of the material in the interstitial space between cellular voids. This contributes to a reduction in the scratch density during polishing.

When the fluoropolymer particles in pads of the present invention are exposed at the pad surface during polishing, the high shear rate arising from the relative motion of the pad and wafer, together with the low shear strength of the fluoropolymer particles, results in plastic flow of the fluoropolymer onto the adjacent portions of the pad surface. Over time, this results in a thin discontinuous fluoropolymer film on the wafer surface. At low levels of particle addition, this results in a heterogeneous surface consisting of urethane-rich and fluoropolymer-rich zones. Polishing pads with this type of heterogeneous surface have a significant polishing rate enhancement for polishing with opposite-charged particles. The effective zeta potential of this heterogeneous surface is controlled by the fluoropolymer used and the relative area of coverage. For example, use of PTFE particles, with a negative zeta potential, yields a pad surface with an enhanced negative zeta potential relative to the parent polymer.

In like fashion, the conditioning debris generated when pads of the present invention are used will also be attractive to slurry particles. Since these debris particles are small, adsorption of slurry particles is expected to lead to the formation of slurry particle/pad particle agglomerates. Polishing operations that form these aggregates are markedly less harmful than in conventional pads for two reasons. First, since the parent debris is much smaller, the resulting agglomerates will also be correspondingly smaller. Second, the agglomerates are expected to have low binding strength due to the heterogeneous nature of their surface. Finally, the fluoropolymers can stabilize the slurry and slow particle settling. This can be significant for ceria-containing and other cationic slurries. For example, the fluoropolymer particles have a settling sensitivity in the slurry containing cationic particles as follows: a) determine settling slope in (%/hour) for the slurry; b) determine settling slope in (%/hour) for the slurry plus 0.1 wt % fluoropolymer particles; and c) slope a)-slope b) being ≥5%/hour. Because slurries only spend a limited amount of time on the polishing pad, a small change in slope can provide a significant decrease in polishing defects.

Pads of the present invention may be used for a wide variety of slurries to achieve enhanced polishing rate and reduced defectivity by the novel means of choosing the fluoropolymer additive to be incorporated and matching it to the slurry particle and pH.

The CMP polishing pads in accordance with the present invention may be made by methods comprising: providing the isocyanate terminated urethane prepolymer; providing separately the curative component; and combining the isocyanate terminated urethane prepolymer and the curative component to form a combination; to allowing the combination to react to form a product; forming a polishing layer from the product, such as by skiving the product to form a polishing layer of a desired thickness and grooving the polishing layer, such as by machining it; and, forming the chemical mechanical polishing pad with the polishing layer.

The isocyanate terminated urethane prepolymer used in the formation of the polishing layer of the chemical mechanical polishing pad of the present invention preferably comprises: a reaction product of ingredients, comprising: a polyfunctional isocyanate and a prepolymer polyol mixture containing two or more components, one of which is a fluoropolymer powder. The fluoropolymer powder does not react with the isocyanate. Rather, it is added to the prepolymer in order to create a uniform dispersion prior to the final polymerization step.

The isocyanate terminated urethane prepolymer used in the formation of the polishing layer of the chemical mechanical polishing pad of the present invention preferably comprises: a reaction product of ingredients, comprising: a polyfunctional isocyanate and a prepolymer polyol mixture containing two or more components, one of which is a fluoropolymer powder. The fluoropolymer powder does not react with the isocyanate. Rather, it is added to the prepolymer in order to create a uniform dispersion prior to the final polymerization step.

The invention works with a variety of polymer matrices, such as polyurethane, polybutadiene, polyethylene, polystyrene, polypropylene, polyester, polyacrylamide, polyvinyl alcohol, polyvinyl chloride polysulfone and polycarbonate. Preferably, the matrix is a polyurethane. For purposes of this specification, "polyurethanes" are products derived from difunctional or polyfunctional isocyanates, e.g. polyetherureas, polyisocyanurates, polyurethanes, polyureas, polyurethaneureas, copolymers thereof and mixtures thereof. The CMP polishing pads in accordance may be made by methods comprising: providing the isocyanate terminated urethane prepolymer; providing separately the curative component; and combining the isocyanate terminated urethane prepolymer and the curative component to form a combination, then allowing the combination to react to form a product. It is possible to form the polishing layer by skiving a cast polyurethane cake to a desired thickness and grooving or perforating the polishing layer. Optionally, preheating a cake mold with IR radiation, induction or direct electrical current can reduce product variability when casting porous polyurethane matrices. Optionally, it is possible to use either thermoplastic or thermoset polymers. Most preferably, the polymer is a crosslinked thermoset polymer.

Preferably, the polyfunctional isocyanate used in the formation of the polishing layer of the chemical mechanical polishing pad of the present invention is selected from the group consisting of an aliphatic polyfunctional isocyanate, an aromatic polyfunctional isocyanate and a mixture thereof. More preferably, the polyfunctional isocyanate used in the formation of the polishing layer of the chemical mechanical polishing pad of the present invention is a diisocyanate selected from the group consisting of 2,4-toluene diisocyanate; 2,6-toluene diisocyanate; 4,4'-diphenylmethane diisocyanate; naphthalene-1,5-diisocyanate; tolidine diisocyanate; para-phenylene diisocyanate; xylylene diisocyanate; isophorone diisocyanate; hexamethylene diisocyanate; 4,4'-dicyclohexylmethane diisocyanate; cyclohexanediisocyanate; and, mixtures thereof. Still more preferably, the polyfunctional isocyanate used in the formation of the polishing layer of the chemical mechanical polishing pad of the present invention is an isocyanate terminated urethane prepolymer formed by the reaction of a diisocyanate with a prepolymer polyol.

Preferably, the isocyanate-terminated urethane prepolymer used in the formation of the polishing layer of the chemical mechanical polishing pad of the present invention has 2 to 12 wt % unreacted isocyanate (NCO) groups. More preferably, the isocyanate-terminated urethane prepolymer used in the formation of the polishing layer of the chemical mechanical polishing pad of the present invention has 2 to 10 wt % (still more preferably 4 to 8 wt %; most preferably 5 to 7 wt %) unreacted isocyanate (NCO) groups.

Preferably the prepolymer polyol used to form the polyfunctional isocyanate terminated urethane prepolymer is selected from the group consisting of diols, polyols, polyol diols, copolymers thereof and mixtures thereof. More preferably, the prepolymer polyol is selected from the group consisting of polyether polyols (e.g., poly(oxytetramethylene)glycol, poly(oxypropylene)glycol and mixtures thereof); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the prepolymer polyol is selected from the group consisting of polytetramethylene ether glycol (PTMEG); ester based polyols (such as ethylene adipates, butylene adipates); polypropylene ether glycols (PPG); polycaprolactone polyols; copolymers thereof; and, mixtures thereof. Most preferably, the prepolymer polyol is selected from the group consisting of PTMEG and PPG.

Preferably, when the prepolymer polyol is PTMEG, the isocyanate terminated urethane prepolymer has an unreacted isocyanate (NCO) concentration of 2 to 10 wt % (more preferably of 4 to 8 wt %; most preferably 6 to 7 wt %). Examples of commercially available PTMEG based isocyanate terminated urethane prepolymers include Imuthane® prepolymers (available from COIM USA, Inc., such as, PET-80A, PET-85A, PET-90A, PET-93A, PET-95A, PET-60D, PET-70D, PET-75D); Adiprene® prepolymers (available from Chemtura, such as, LF 800A, LF 900A, LF 910A, LF 930A, LF 931A, LF 939A, LF 950A, LF 952A, LF 600D, LF 601D, LF 650D, LF 667, LF 700D, LF750D, LF751D, LF752D, LF753D and L325); Andur® prepolymers (available from Anderson Development Company, such as, 70APLF, 80APLF, 85APLF, 90APLF, 95APLF, 60DPLF, 70APLF, 75APLF).

Preferably, when the prepolymer polyol is PPG, the isocyanate terminated urethane prepolymer has an unreacted isocyanate (NCO) concentration of 3 to 9 wt % (more preferably 4 to 8 wt %, most preferably 5 to 6 wt %). Examples of commercially available PPG based isocyanate terminated urethane prepolymers include Imuthane® prepolymers (available from COIM USA, Inc., such as, PPT-80A, PPT-90A, PPT-95A, PPT-65D, PPT-75D); Adiprene® prepolymers (available from Chemtura, such as, LFG 963A, LFG 964A, LFG 740D); and, Andur® prepolymers (available from Anderson Development Company, such as, 8000APLF, 9500APLF, 6500DPLF, 7501DPLF).

Preferably, the isocyanate terminated urethane prepolymer used in the formation of the polishing layer of the chemical mechanical polishing pad of the present invention is a low free isocyanate terminated urethane prepolymer having less than 0.1 wt % free toluene diisocyanate (TDI) monomer content.

Non-TDI based isocyanate terminated urethane prepolymers can also be used. For example, isocyanate terminated urethane prepolymers include those formed by the reaction of 4,4'-diphenylmethane diisocyanate (MDI) and polyols such as polytetramethylene glycol (PTMEG) with optional diols such as 1,4-butanediol (BDO) are acceptable. When such isocyanate terminated urethane prepolymers are used, the unreacted isocyanate (NCO) concentration is preferably 4 to 10 wt % (more preferably 4 to 10 wt %, most preferably 5 to 10 wt %). Examples of commercially available isocyanate terminated urethane prepolymers in this category include Imuthane® prepolymers (available from COIM USA, Inc. such as 27-85A, 27-90A, 27-95A); Andur® prepolymers (available from Anderson Development Company, such as, IE75AP, IE80AP, IE 85AP, IE90AP, IE95AP, IE98AP); and, Vibrathane® prepolymers (available from Chemtura, such as, B625, B635, B821).

The polishing layer of the chemical mechanical polishing pad of the present invention may further contain a plurality of microelements. Preferably, the plurality of microelements are uniformly dispersed throughout the polishing layer. Preferably, the plurality of microelements is selected from entrapped gas bubbles, hollow core polymeric materials, liquid filled hollow core polymeric materials, water soluble materials and an insoluble phase material (e.g., mineral oil). More preferably, the plurality of microelements is selected from entrapped gas bubbles and hollow core polymeric materials uniformly distributed throughout the polishing layer. Preferably, the plurality of microelements has a weight average diameter of less than 150 µm (more preferably of less than 50 µm; most preferably of 10 to 50 µm). Preferably, the plurality of microelements comprises polymeric microballoons with shell walls of either polyacrylonitrile or a polyacrylonitrile copolymer (e.g., Expancel® microspheres from Akzo Nobel). Preferably, the plurality of microelements is incorporated into the polishing layer to at 0 to 50 vol. % porosity (Preferably 10 to 35 vol. % porosity). The vol. % of porosity is determined by dividing the difference between the specific gravity of an unfilled polishing layer and specific gravity of the microelement containing polishing layer by the specific gravity of the unfilled polishing layer. Preferably, the fluoropolymer particles having an average particle size less than the average spacing of the polymeric microelements to improve particle distribution, reduce viscosity and facilitate casting.

The polishing layer of the CMP polishing pad of the present invention can be provided in both porous and nonporous (i.e., unfilled) configurations. Preferably, the polishing layer of the chemical mechanical polishing pad of the present invention exhibits a density of 0.4 to 1.15 g/cm$^3$ (more preferably, 0.70 to 1.0; as measured according to ASTM D1622 (2014)).

Preferably, the polishing layer of the chemical mechanical polishing pad of the present invention exhibits a Shore D hardness of 28 to 75 as measured according to ASTM D2240 (2015).

Preferably, the polishing layer has an average thickness of 20 to 150 mils (510 to 3,800 μm). More preferably, the polishing layer has an average thickness of 30 to 125 mils (760 to 3200 μm). Still more preferably 40 to 120 mils (1,000 to 3,000 μm); and most preferably 50 to 100 mils (1300 to 2500 μm).

Preferably, the CMP polishing pad of the present invention is adapted to be interfaced with a platen of a polishing machine. Preferably, the CMP polishing pad is adapted to be affixed to the platen of a polishing machine. Preferably, the CMP polishing pad can be affixed to the platen using at least one of a pressure sensitive adhesive and vacuum.

The CMP polishing pad of the present invention optionally further comprises at least one additional layer interfaced with the polishing layer. Preferably, the CMP polishing pad optionally further comprises a compressible base layer adhered to the polishing layer. The compressible base layer preferably improves conformance of the polishing layer to the surface of the substrate being polished.

The CMP polishing pad of the present invention in its final form further comprises the incorporation of texture of one or more dimensions on its upper surface. These may be classified by their size into macrotexture or microtexture. Common types of macrotexture employed for CMP control hydrodynamic response and/or slurry transport, and include, without limitation, grooves of many configurations and designs, such as annular, radial, and cross-hatchings. These may be formed via machining processes to a thin uniform sheet, or may be directly formed on the pad surface via a net shape molding process. Common types of microtexture are finer scale features that create a population of surface asperities that are the points of contact with the substrate wafer where polishing occurs. Common types of microtexture include, without limitation, texture formed by abrasion with an array of hard particles, such as diamond (often referred to as pad conditioning), either prior to, during or after use, and microtexture formed during the pad fabrication process.

An important step in substrate polishing operations is determining an endpoint to the process. One popular in situ method for endpoint detection involves providing a polishing pad with a window, which is transparent to select wavelengths of light. During polishing, a light beam is directed through the window to the substrate surface, where it reflects and passes back through the window to a detector (e.g., a spectrophotometer). Based on the return signal, properties of the substrate surface (e.g., the thickness of films thereon) can be determined for endpoint detection purposes. To facilitate such light based endpoint methods, the chemical mechanical polishing pad of the present invention, optionally further comprises an endpoint detection window. Preferably, the endpoint detection window is selected from an integral window incorporated into the polishing layer; and, a plug in place endpoint detection window block incorporated into the chemical mechanical polishing pad. For unfilled pads of the present invention that have sufficient transmittance, the upper pad layer itself can be used as the window aperture. If the polymer phase of pads of the present invention exhibit phase separation, a transparent region of the top pad material can also be produced by locally increasing the cooling rate during fabrication to locally inhibit phase separation, resulting in a more transparent region suitable for use as the endpointing window.

CMP polishing pads are used in conjunction with a polishing slurry, as described in the background of the invention. Pads of the present invention may be used for a wide variety of slurries to achieve enhanced polishing rate and reduced defectivity by the novel means of choosing the fluoropolymer additive to be incorporated and matching it to the slurry particle and pH.

CMP polishing pads of the present invention are designed for use with slurries whose pH is either above or below the isoelectric pH of the particle being used. Maximum rate can be selected via the choice of the fluoropolymer based on simple criteria. For example, $CeO_2$ has an isoelectric pH of ~6.5. Below this pH, the particle surface has a net positive charge. Above this pH, the particle has a net negative charge. If the slurry pH is below the isoelectric pH of the slurry particle, then selection of a pad that contains a fluoropolymer particle addition that has a negative zeta potential at that pH will produce the maximum improvement in removal rate, e.g., PTFE or PFA. In like fashion, for a slurry using colloidal or fumed silica particles with a high pH (e.g., 10), maximum polishing rate will be achieved by selection of a pad which contains a fluoropolymer particle addition which has a positive zeta potential at that pH, i.e., PVF. This is a very attractive capability as it allows rate enhancement for virtually any slurry.

A significant novel advantage for pads of the present invention when used with silica slurries is that, as described in the background of the invention, the additional effect of the electrostatic attraction between the inventive pad and the silica particles is the ability to affect a significant reduction in the amount of particles used in the slurry to produce polishing rate achieved with prior art pads. This provides significant cost advantages to the user.

The CMP pads of the present invention may be manufactured by a variety of processes that are compatible with thermoset urethanes. These include mixing the ingredients as described above and casting into a mold, annealed, and sliced into sheets of the desired thickness. Alternatively, they may be made in a more precise net shape form. Preferred processes in accordance with the present invention include: 1. thermoset injection molding (often referred to as "reaction injection molding" or "RIM'), 2. thermoplastic or thermoset injection blow molding, 3. compression molding, or 4. any similar-type process in which a flowable material is positioned and solidified, thereby creating at least a portion of a pad's macrotexture or microtexture. In a preferred molding embodiment of the present invention: 1. the flowable material is forced into or onto a structure or Substrate; 2. the Structure or Substrate imparts a Surface texture into the material as it Solidifies, and 3. the Structure or Substrate is thereafter separated from the Solidified material.

Some embodiments of the present invention will now be described in detail in the following examples.

EXAMPLES: SAMPLE PREPARATION

Samples of polishing pads, high-strength polyurethane (Sample A), medium porosity polyurethane having an pore size of 40 μm (Sample B) and low-porosity polyurethane having an pore size of 20 μm (Sample C), were produced with varying additions of four different commercial fluoropolymer powders, PTFE-1 (Chemours Zonyl™ MP-1000 particles), PTFE-2 (Chemours Zonyl™ MP-1200 particles), PFA (Solvay P-7010 copolymer of tetrafluoroethylene (TFE) and perfluoroalkylvinylethers (PFAVE) particles), and PVF (Nitrogen terminated polyvinyl fluoride particles) in the upper pad material. From manufacturer's data, the surface weighted mean particle sizes were MP-1000 1.6 μm, MP-1200-1.7 μm vs. 8.9 μm for the PFA sample. The fluoropolymer powders were added to the prepolymer component of the polyurethane formulation prior to mixing with the curative component and a gas or liquid filled polymeric microelement component, present in the pads, to ensure a uniform distribution in the final cured polyurethane. After preparation, equivalent pads with and without fluoropolymer particles were prepared and tested.

Example 1

The physical properties of a set of Sample A made with and without the addition of 10 weight percent of PTFE-1 and PFA were conducted. As shown in the Table below, changes of note were the reduction in tensile strength, hardness and the majority of the mechanical properties. Of specific interest was the difference in the effect of additions on the shear storage modulus (G'), which was characteristic of elastic behavior versus the effect on the shear loss modulus (G"), which represents the amount of energy dissipated in the sample. Shear storage modulus G' at 40° C. showed a significant reduction relative to the control (−31% for PFA and −45% for PTFE). Shear loss modulus, G" showed a similar trend (−26% for PFA and −37% for PTFE). While all samples were primarily elastic polymers, tan δ, the ratio of G" to G', increased by 6% and 14% for PFA and PTFE additions, respectively. This was a direct measure of the increase in the energy dissipation effected by the fluoropolymer addition. A similar trend was observed for tensile strength, which decreased by 6% for PFA addition and 14% for PTFE addition.

TABLE 1

Physical Property Comparison of High-Strength Polishing Pads with and without Fluoropolymer Particle Additions

| Pad Sample | Density, g/cm³ | Shore D Hardness, 2 sec | G' at 30° C. (MPa) | G' at 40° C. (MPa) | G" at 40° C. (MPa) | G' (30° C.)/ G' (90° C.) | Tensile Strength 23° C. (MPa) | Young's Modulus 23° C. (MPa) | Toughness 23° C. (MPa) |
|---|---|---|---|---|---|---|---|---|---|
| A | 0.975 | 63.5 | 215.8 | 172.6 | 23.92 | 3.16 | 31.2 | 328.9 | 58.6 |
| A-PFA | 1.119 | 62.9 | 154.9 | 119.6 | 17.62 | 3.09 | 28.3 | 315.3 | 58.2 |
| A-PTFE | 1.065 | 59.1 | 125.0 | 95.4 | 14.97 | 3.06 | 26.5 | 302.5 | 46.8 |

The data indicate that the fluoropolymer doped materials have decreased physical properties in relation to the parent material. This decrease in physical properties indicated that the tensile strength of the fluoropolymer was less than that of the tensile strength of the matrix of Sample A. Tensile strength was measured in accordance with ASTM D412.

Microscopic analysis of the fluoropolymer doped pads revealed the presence of discrete fluoropolymer particles, confirmed via EDS analysis, which were randomly distributed within the polymer matrix. The fluorocarbon particles showed no evidence of attraction to or interaction with the flexible polymeric microelements that were also present.

Example 2

The deionized water contact angle was measured on a set of medium porosity polyurethane pads of Sample B that had varying amounts of PTFE-2 added during manufacturing. As shown in FIG. 1, the contact angle increased directly with increasing PTFE content to a steady state value of around 140 degrees by 7.5% PTFE content. All pads with both PTFE and PFA additions were visibly more hydrophobic than the parent pad. Despite this, the polishing surface is hydrophilic as measured with distilled water at a pH of 7 at a surface roughness of 10 μm rms after soaking in distilled water for five minutes.

Example 3

A polishing test was performed on a set of high-strength Sample A pads with and without the addition of PTFE and PFA in order to demonstrate the beneficial effects of the present invention. The concentration of each fluoropolymer added was 8.1%. Three slurries were tested on each pad set using 60 200 mm TEOS monitor wafers per test on an Applied Materials Mirra CMP polishing tool. The slurries used were two ceria slurries (Asahi CES333F2.5 and DA Nano STI2100F) and a fumed silica slurry (Cabot SS25). Conditions used were 3 psi (20.7 kPa) downforce, 93 rpm platen speed, 87 rpm carrier speed, and 150 ml/minute slurry flow. Conditioners varied by slurry type. For the ceria slurries, a Saesol LPX-C4 diamond conditioner disk was used. For the silica slurry, a Saesol AK45 conditioner disk was used. All conditioners were used concurrently with polishing at 7 lb force (3.2 kgf). For each run, a pad break-in conditioning step was used for 20 minutes at 7 lb force (3.2 kgf) to ensure a uniform initial pad texture. Polishing removal rate and defectivity summaries are shown below in Tables 2 and 2A. The polishing in Example 3 occurred at pH below the isoelectric point of ceria for the Asahi and DaNano slurries and a pH above the isoelectric point for silica with SS25 slurry.

tested, the control pad showed a rise in COF at downforce below 2 psi (13.8 kPa). The difference was attributed to the lower roughness observed for the PTFE-containing pad.

Figure 3:
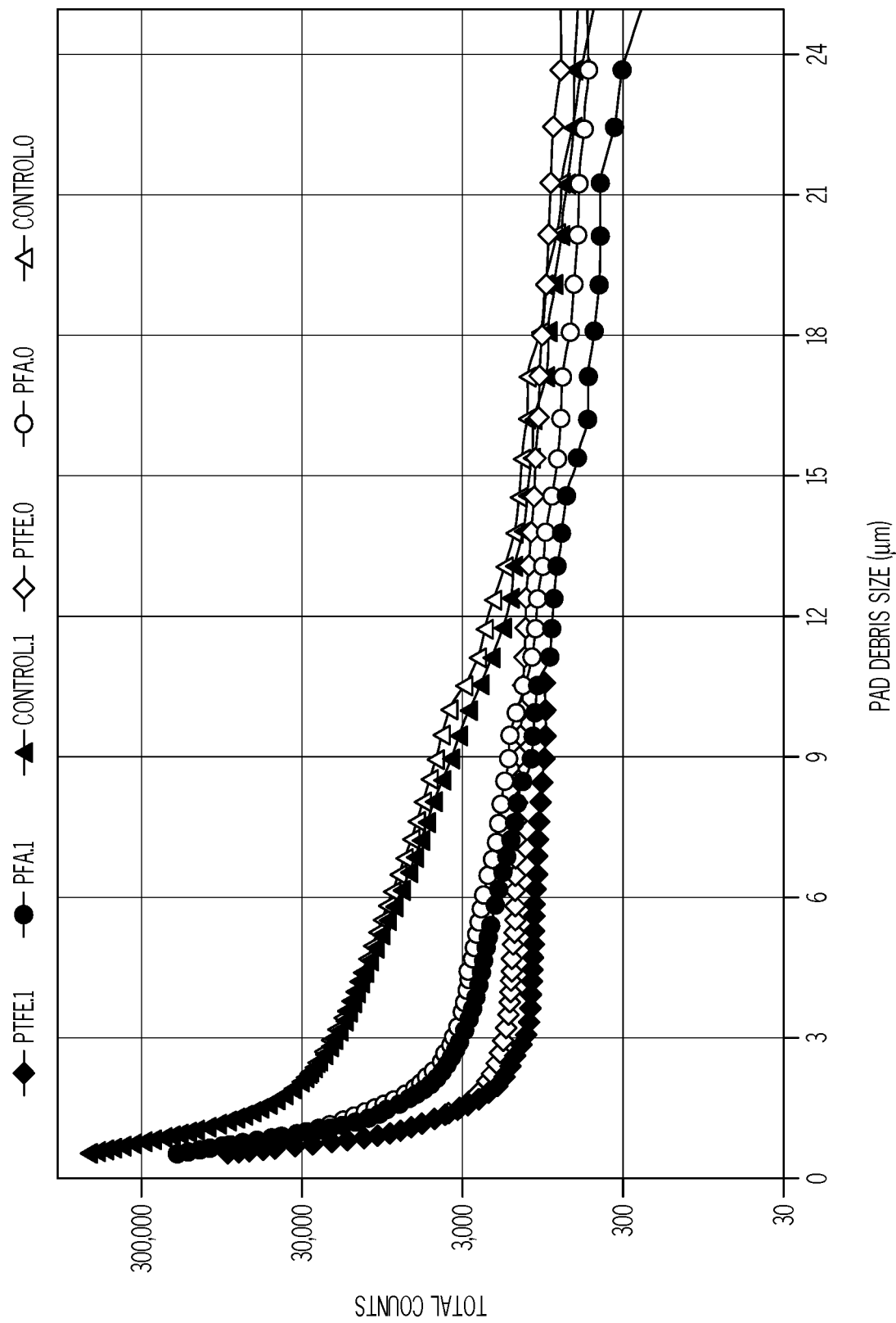
FIG. 3 is a plot of conditioner debris size for a high-strength polyurethane polishing pad versus that obtained with PFA and PTFE additions.

Another test was conducted to gain insight into the effects of fluoropolymer additions on the conditioning process. In this test a Buehler tabletop polisher was used to simulate the effects of the conditioning process. Pad samples were mounted and conditioned with a Saesol AK45 conditioner disk that was used at 10 lb force (4.5 kgf) with deionized water to simulate the effects of pad break-in. Effluent samples were taken at the beginning and end of the break-in cycle, and particle size distribution was measured with an Accusizer particle analysis tool. As shown in FIG. 3, a significant reduction in the pad debris size distribution was observed for both PTFE- and PFA-containing pads relative to the control pad. The most significant size reduction

TABLE 2

| PTFE -1 Additive | | Removal Rate (A/min) | | | Average Scratch & Chatter marks | | |
|---|---|---|---|---|---|---|---|
| 8.1 wt % Slurry | Slurry Type | Sample A- Control | Sample A- PTFE | Comparison | Sample A- Control | Sample A- PTFE | Comparison |
| Asahi CES333F2.5 | Ceria | 1,600 | 2,500 | 57% Higher | 28 | 20 | 30% Lower |
| DA Nano STI2100F | Ceria | 1,040 | 1,200 | 15% Higher | 38 | 22 | 40% Lower |
| SS25 | Silica | 2,500 | 2,680 | Similar | 28 | 32 | 12% Higher |

TABLE 2A

| PFA Additive | | Removal Rate (A/min) | | | Average Scratch & Chatter marks | | |
|---|---|---|---|---|---|---|---|
| 8.1 wt % Slurry | Slurry Type | Sample A- Control | Sample A- PTFE | Comparison | Sample A- Control | Sample A- PTFE | Comparison |
| Asahi CES333F2.5 | Ceria | 2,029 | 2,268 | 12% Higher | 20 | 10 | 50% Lower |
| DA Nano STI2100F | Ceria | 1,308 | 1,490 | 14% Higher | 25 | 26 | Similar |
| SS25 | Silica | 2,559 | 2,614 | Similar | 30 | 33 | 10% Higher |

Polish rate increased substantially and defect levels, particularly scratches and chattermarks, diminished substantially when the fluoropolymer particle-containing pads of the present invention were used in conjunction with a cationic ceria-containing slurries. When an anionic silica-containing slurry was used, no such improvement resulted. This charge-specific response with ceria increasing rate and lowering defects was unexpected.

Figure 2:
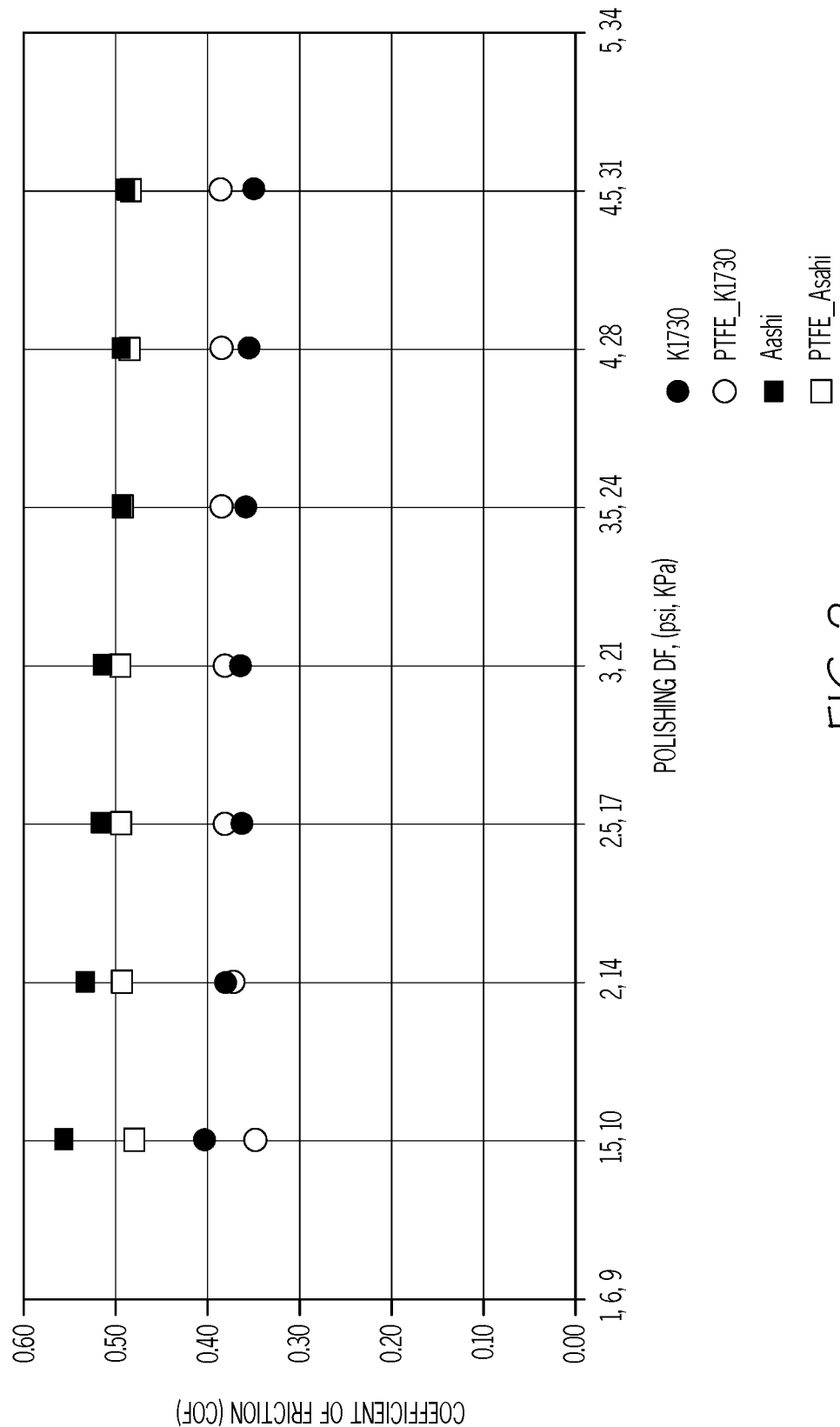
FIG. 2 is measurement of coefficient of friction data for a high-strength polyurethane polishing pad versus a PTFE containing version as generated with a colloidal-silica slurry and a colloidal-ceria slurry.

In order to gain more insight into the observed improvements, several tests were conducted. Comparison of post-polish pad roughness for the Sample A with PFA additive showed reduced roughness relative to the control (18% reduction in rms roughness as measured by a Nanofocus laser profilometer). In addition, coefficient of friction (COF) measurements were made during polishing with a ceria-containing slurry (CES333F2.5) and a silica-based slurry (Klebosol 1730) for the high-strength pads with and without the addition of 8.1 wt % PTFE. Polishing conditions were the same as used for the tests described in Tables 2 and 2A. As shown in FIG. 2, for the silica slurry, no significant difference in COF between the control and the PTFE sample over the range of downforce tested. For the ceria slurry, a higher COF was observed for both control and the PTFE sample. At higher downforce, no significant differences in COF were observed, indicating that the PTFE pad additive did not act as a lubricant. While the PTFE sample had a near-constant COF over the entire range of downforce occurred for particles in the 1-10 micron range. This was consistent with the reduction in scratch defects when the two fluoropolymers were added to the parent pad.

While the tests outlined above can explain an aspect of the defectivity improvements of the present invention, it did not shed light on the observed increases in polishing rate. Accordingly, additional tests were conducted.

Figure 4:
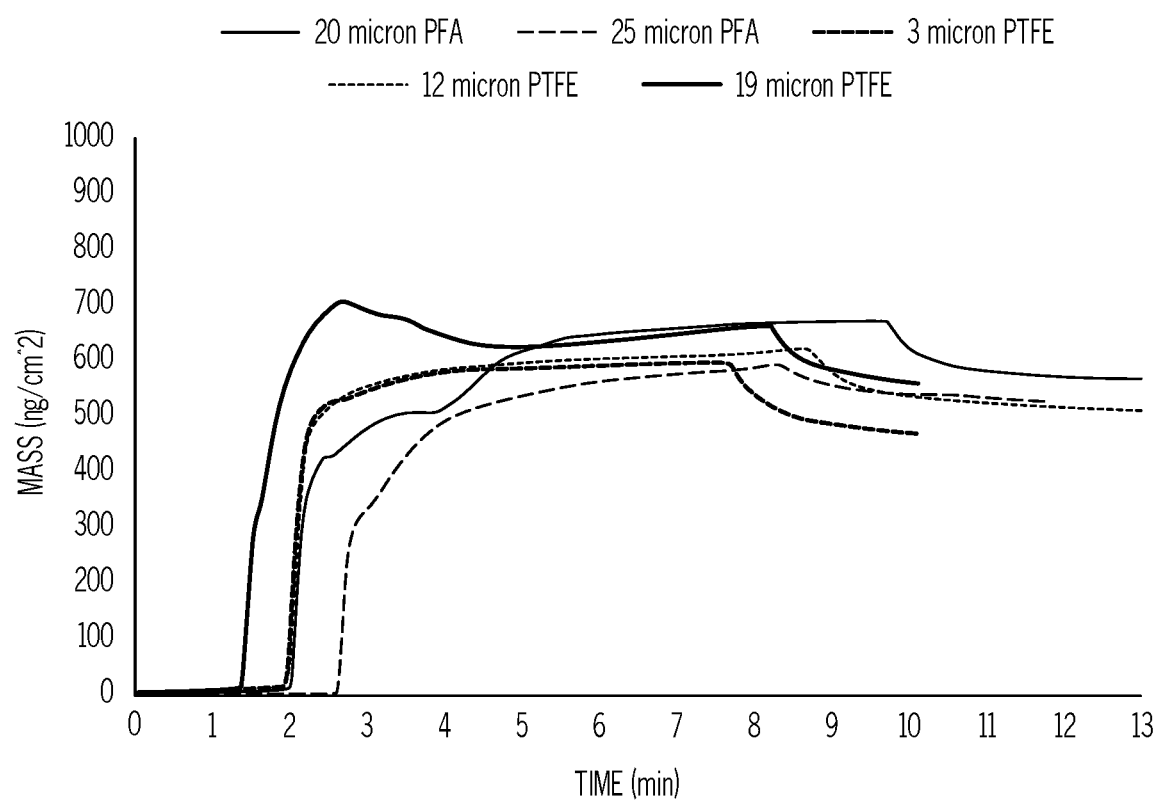
FIG. 4 is a QCM plot showing interaction between PFA and PTFE particles and a ceria crystal.

The interactions between ceria (cerium oxide) and the fluoropolymer additives used in the pad samples were probed using quartz crystal micro-balance (QCM) measurements. During the QCM measurement, dilute dispersions of PTFE and PFA particles in deionized water (pH 6) were passed through a flow cell containing a ceria crystal. Adsorption of particles on ceria crystal was demonstrated by increase in mass measured by a sensitive micro-balance. As shown in FIG. 4, attractive interactions between ceria crystal and PTFE/PFA particles of several different sizes were observed. Since the zeta potential of the ceria crystal at the test pH was positive, results indicate that the fluoropolymer particles have a negative zeta potential. This indicated an extremely high negative zeta potential, which is driven by the hydrophobic surface and its effect on the water dipole orientation. This effect is very different from the (negative) zeta potential of polyurethanes, which is driven by the structural hydroxyl groups present in the polymer chain.

Conclusions from this test and the other data presented is that the presence of the fluoropolymer particles at the pad surface helps to increase polishing rate by increasing the overall attraction of ceria particles to the pad surface and, therefore raising the overall number of particle/wafer interactions per unit time during polishing. This effect does not occur when negatively charged silica particles are used in slurries, as the electrostatic repulsion prevents a desirably high surface concentration of particles from occurring.

In addition, the stability of the slurries was evaluated using a Lumisizer dispersion analyzer settling study. The dispersion analyzer operated in accordance with ISO/TR 1309, ISO/TR 18811, ISO18747-1 and ISO13318-2. Sample of slurries with and without fluoropolymer additives were centrifuged with the transmission of light through the sample measured to determine how quickly the slurry particles settled. This being a measure of the stability of the slurries and thus aggregation. The slopes of the measurements with 0.1 wt % additive and without are shown in Table 3. If the fluoropolymer particles do not wet, then it becomes necessary to a minimal amount of surfactant as necessary to wet the particles, such as Merpol™ A alcohol phosphate nonionic surfactant from Stepan Company, to render the particles water soluble.

TABLE 3

Dispersion Data

| Sample | Slope (%/hour) |
|---|---|
| DANano control | 296 |
| Asahi control | 622 |
| SS25 control | 14 |
| DANano w/PTFE | 285 |
| DANano w/PFA | 290 |
| Asahi w/PTFE | 601 |
| Asahi w/PFA | 601 |
| SS25 w/PTFE | 9 |
| SS25 w/PFA | 9 |

The slopes for samples with additives were consistently lower than those without, indicating that they settle more slowly and were thus, more stable. This indicated that a reduction in defect could also originate from preventing ceria particle agglomeration for ceria particle containing slurries, such as DANano and Asahi. The relative stability of silica slurries, such as SS25 may explain the limited defectivity improvement seen with fluoropolymer additives as ceria is more susceptible to aggregation.

Example 4

To further illustrate the role of fluoropolymer additions on the properties of the pad surface during polishing, a series of pads were prepared using low-porosity polyurethane of Sample C as the base with varying additions of PTFE-2 particles. Samples of each were polished using the process and slurry described in Example 3. Following the polishing tests, polished samples of each pad were analyzed via X-ray Photoelectron Spectroscopy (XPS) and Energy-Dispersive X-ray Spectroscopy (EDS), to obtain compositional information on the effects of polishing. XPS has a surface penetration depth of ~1-10 nm, making it an extremely sensitive method of determining the composition of the surface region, while EDS has a penetration depth of ~1-10 um, which gives information about the bulk concentration.

TABLE 4

| | XPS | | EDS | |
|---|---|---|---|---|
| PTFE % | F (atom %) | F/C | F (atom %) | F/C |
| 0% | 0 | | 0 | |
| 2% | 25.5 | 0.25 | 3 | 0.045 |
| 5% | 37.7 | 0.74 | 6.8 | 0.1 |
| 10% | 45.5 | 1 | 8.3 | 0.132 |

As shown in Table 4, the surface of the used pads containing fluoropolymer showed substantial enrichment of fluorine at the outer surface relative to the bulk. This is strong evidence for the existence of a fluorocarbon film on the pad surface during polishing.

Example 5

To obtain more information on the characteristics of the polished pad surface layer of the inventive pads, polishing tests were performed on a control pad and an inventive pad containing 10 wt % PTFE. The overall process and slurry described in Example 3 using the polishing pad of Example 4. For this test, three different conditioners were used to assess their effects on polishing rate and texture. Conditioner AB45 was a conditioner developed for use with ceria slurries, which produces a low roughness pad surface. Conditioner AK45 is a more aggressive conditioner with larger diamonds at a higher density. Conditioner LPX-V1 is a very aggressive conditioner employing a combination of large and small diamonds. After polishing, the surface textures of the used pads were examined using a NanoFocus non-contact laser profilometer.

Figure 5A:
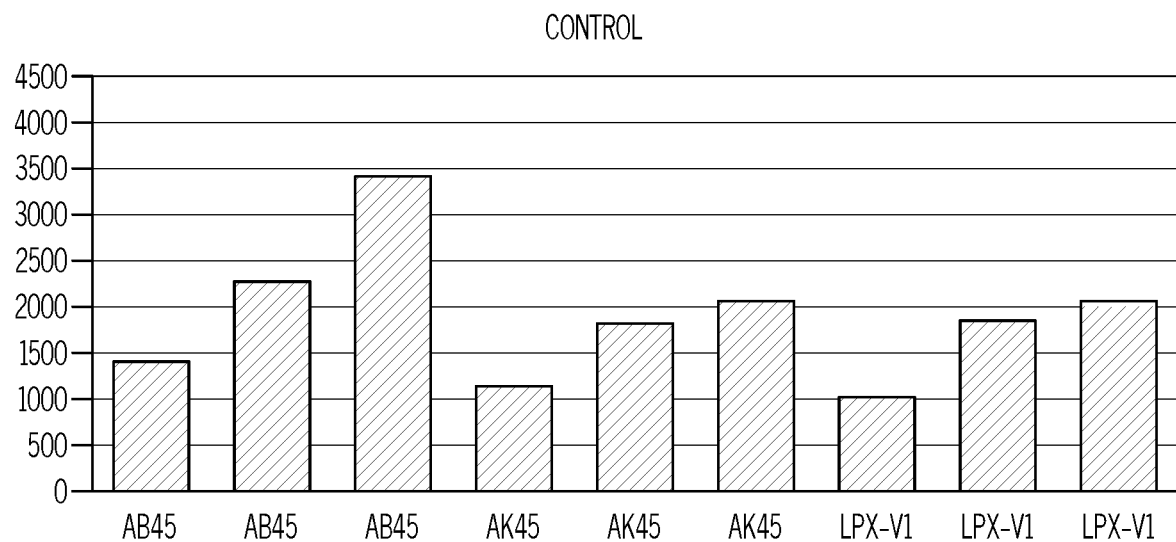
FIG. 5A is a plot of TEOS removal rate in Å/min. for a soft polyurethane polishing pad without a PTFE particle additions.
Figure 5B:
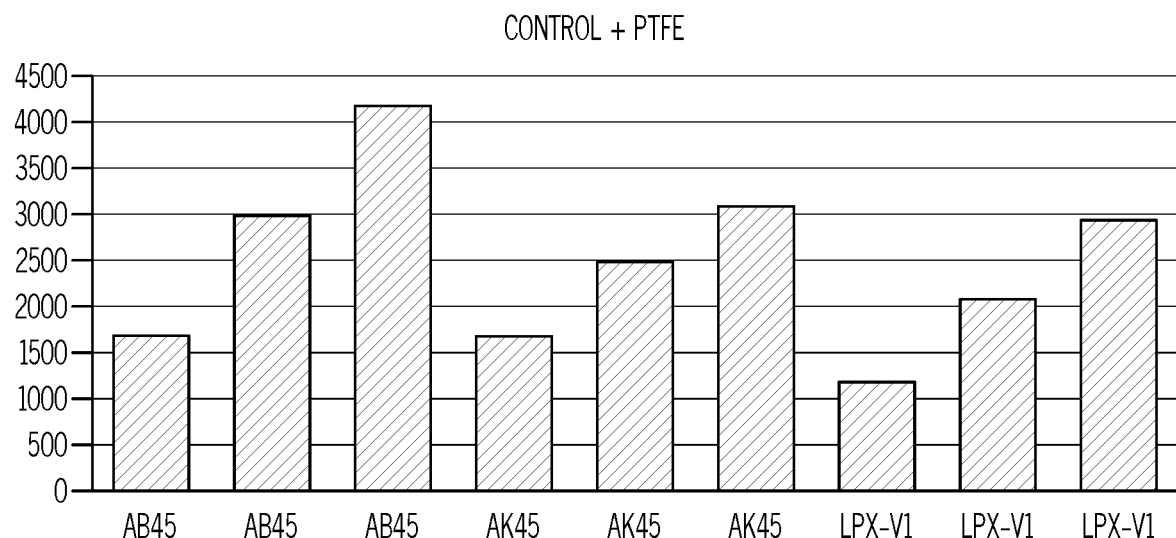
FIG. 5B is a plot of TEOS removal rate in Å/min. for a soft polyurethane polishing pad with a PTFE particle additions.

FIG. 5A shows TEOS removal rates for the prior art control pad for each of the three conditioners tested at three different polishing pressures (2, 3, and 4 psi, 13.8, 20.7 and 27.6 kPa). The low roughness conditioner produced the highest removal rate, with little difference in rate effect for the other two conditioners. For the inventive pad (FIG. 5B) polishing rates for all three conditioners were significantly higher for all three conditioners, relative to the control.

Figure 6:
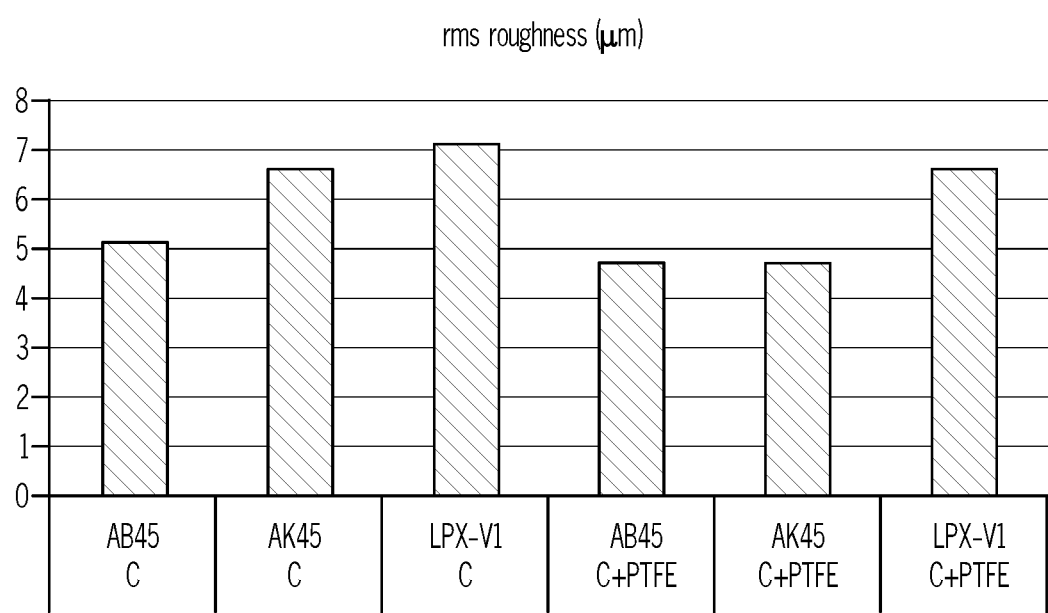
FIG. 6 is a plot of surface roughness for a soft polyurethane polishing pad with and without a PTFE particle addition.

Profilometry measurements were performed at the midpoint of the polishing area using a Nano-focus confocal 3D surface metrology tool. A comparison of the Root Mean Square (rms) roughness, measured in accordance with ISO 25178, for each pad and conditioner is shown in FIG. 6. For the prior art control pad, RMS roughness increased directly with conditioner aggressiveness. In contrast, the RMS roughness of the inventive pad was significantly lower for all conditioners.

Example 6

To further illustrate the criticality of zeta potential on rate for fluoropolymer additions, pads prepared with particle additions of PVF were assessed for zeta potential and polishing performance with the same silica-based and ceria-based commercial slurries used in Example 3. As shown in Table 5 below, the zeta potentials for the additives used in pads of Example 3 and nitrogen-terminated PVF are quite different.

TABLE 5

Zeta potentials of fluoropolymer powders

| Sample | Zeta Potential (mV) |
| --- | --- |
| PTFE in water | −36.3 |
| PFA in water | −47.3 |
| PVF in water | 33.6 |

The zeta potentials of PTFE and PFA were highly negative, while that of the PVF used was strongly positive. The addition of the cationic PVF to a pad of the present invention produced a heterogeneous surface containing regions of positive and negative surface charge. Despite the overall pad surface being electronegative, the resulting pad surface provided attraction of slurry particles with a negative charge, such as colloidal silica with a corresponding increase in polishing rate. Likewise, charge repulsion to slurry particles with a positive charge, such as ceria, in a slurry whose pH is below the isoelectric pH of the particle, produced a reduced removal rate due to the reduce area of attraction on the pad surface and the corresponding reduction in active slurry particles on the pad contact surface.

Accordingly, a comparative polishing test was conducted using samples of a low-porosity polyurethane polishing pad of Sample C, with and without a 10 wt % addition of PVF during sample manufacturing. These pads were used to polish TEOS wafers using conditions identical to those used in Example 3.

TABLE 6

| | | Removal rate (Å/min) | | |
| --- | --- | --- | --- | --- |
| Slurry | Slurry Type | Control C | C + 10 wt % PVF | Comparison to Control |
| SS25 | Silica | 1656 | 1912 | 15% higher |
| DANano STI12100F | Ceria | 1650 | 799 | 52% lower |

As can be seen in Table 6, the polishing rate results showed the opposite trend to Example 4, i.e., the pad of the current invention with the cationic additive enhanced the rate of the negatively charged silica slurry, while the rate when used with a slurry with a positively charged particle was reduced.

The polymer-polymer composite polishing pads of the invention provide an unexpected large increase in polishing removal rate with a large decrease in polishing defects. A relatively small amount of fluoropolymer particle covers less than the entire surface to increase polishing efficiency without compromising the polishing pad's hydrophilic surface required for efficient slurry distribution.

We claim:

1. A polymer-polymer composite polishing pad useful for polishing or planarizing a substrate of at least one of semiconductor, optical and magnetic substrates, the polymer-polymer composite polishing pad comprising the following:
    a polishing layer having a polishing surface for polishing or planarizing the substrate;
    a polymeric matrix forming the polishing layer, the polymer matrix having a tensile strength, the polymer matrix including gas-filled or liquid-filled polymeric microelements; and
    fluoropolymer particles embedded in the polymeric matrix between the gas-filled or liquid-filled polymeric microelements, the fluoropolymer particles having a tensile strength lower than the tensile strength of the polymeric matrix wherein diamond abrasive materials cut the fluoropolymer to form a reduced number of pad debris particles in the 1 μm to 10 μm size range.

2. The polymer-polymer composite of claim 1 wherein the fluoropolymer particles embedded in the polymeric matrix represents 2 to 30 volume percent of the polymer-polymer composite polishing pad.

3. The polymer-polymer composite of claim 1 wherein the fluoropolymer has a more negative zeta potential than the polymeric matrix as measured at a pH 7 in distilled water, for preferential attraction of positively charged abrasive particles.

4. The polymer-polymer composite of claim 1 wherein the fluoropolymer particles attracts positively charged particles from a cationic particle slurry for increasing polishing removal rate when using cationic charged abrasive particles.

5. The polymer-polymer composite of claim 1 wherein the fluoropolymer particles attract negatively charged particles from an anionic particle slurry for increasing polishing removal rate when using anionic charged abrasive particles.

6. A polymer-polymer composite polishing pad useful for polishing or planarizing a substrate of at least one of semiconductor, optical and magnetic substrates, the polymer-polymer composite polishing pad comprising the following:
    a polishing layer having a polishing surface for polishing or planarizing the substrate;
    a polymeric matrix forming the polishing layer, the polymer matrix having a tensile strength, the polymer matrix including gas-filled or liquid-filled polymeric microelements; and
    fluoropolymer particles embedded in the polymeric matrix between the gas-filled or liquid-filled polymeric microelements, the fluoropolymer particles having an average particle size less than the average spacing of the polymeric microelements, the fluoropolymer particles having a tensile strength lower than the tensile strength of the polymeric matrix wherein diamond abrasive materials cut the fluoropolymer to form a reduced number of pad debris particles in the 1 μm to 10 μm size range.

7. The polymer-polymer composite of claim 6 wherein the fluoropolymer particles embedded in the polymeric matrix represents 2 to 30 volume percent of the polymer-polymer composite polishing pad.

8. The polymer-polymer composite of claim 6 wherein the fluoropolymer has a more negative zeta potential than the polymeric matrix as measured at a pH 7 in distilled water, for preferential attraction of positively charged abrasive particles.

9. The polymer-polymer composite of claim 6 wherein the fluoropolymer particles attract positively charged particles from a cationic particle slurry for increasing polishing removal rate when using cationic charged abrasive particles.

10. The polymer-polymer composite of claim 6 wherein the fluoropolymer particles attract negatively charged particles from an anionic particle slurry for increasing polishing removal rate when using anionic charged abrasive particles.

* * * * *